United States Patent
Taki

(10) Patent No.: US 9,481,846 B2
(45) Date of Patent: Nov. 1, 2016

(54) SLIDING FILM, MEMBER ON WHICH SLIDING FILM IS FORMED, AND MANUFACTURING METHOD THEREFOR

(71) Applicant: NIKON CORPORATION, Tokyo (JP)

(72) Inventor: Yusuke Taki, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/837,482

(22) Filed: Aug. 27, 2015

(65) Prior Publication Data

US 2015/0368579 A1 Dec. 24, 2015

Related U.S. Application Data

(63) Continuation of application No. PCT/JP2014/054332, filed on Feb. 24, 2014.

(30) Foreign Application Priority Data

Feb. 28, 2013 (JP) ................. 2013-039900

(51) Int. Cl.
| | |
|---|---|
| *C10M 103/04* | (2006.01) |
| *G03B 17/14* | (2006.01) |
| *C23C 14/06* | (2006.01) |
| *H04N 5/232* | (2006.01) |

(52) U.S. Cl.
CPC ........ *C10M 103/04* (2013.01); *C23C 14/0605* (2013.01); *G03B 17/14* (2013.01); *H04N 5/23209* (2013.01)

(58) Field of Classification Search
CPC ...................................................... G03B 17/14
See application file for complete search history.

(56) References Cited

U.S. PATENT DOCUMENTS

| | | |
|---|---|---|
| 6,143,142 A | 11/2000 | Shi et al. |
| 6,208,407 B1 | 3/2001 | Loopstra |
| 6,262,796 B1 | 7/2001 | Loopstra et al. |
| 6,341,007 B1 | 1/2002 | Nishi et al. |
| 6,611,316 B2 | 8/2003 | Sewell |

(Continued)

FOREIGN PATENT DOCUMENTS

| | | |
|---|---|---|
| EP | 0 579 983 A1 | 1/1994 |
| EP | 2 568 059 A1 | 3/2013 |

(Continued)

OTHER PUBLICATIONS

Mar. 25, 2014 Search Report issued in International Patent Application No. PCT/JP2014/051234.

(Continued)

*Primary Examiner* — WB Perkey
*Assistant Examiner* — Noam Reisner
(74) *Attorney, Agent, or Firm* — Oliff PLC

(57) ABSTRACT

There is provided a sliding film formed on a surface of a member which slides relative to another member. The sliding film includes, a metal-doped tetrahedral amorphous carbon layer; and a surface layer that is formed on top of the metal-doped tetrahedral amorphous carbon layer and has a higher coefficient of kinetic friction than the metal-doped tetrahedral amorphous carbon layer.

18 Claims, 7 Drawing Sheets

(56) References Cited

U.S. PATENT DOCUMENTS

| | | | |
|---|---|---|---|
| 6,778,257 | B2 | 8/2004 | Bleeker et al. |
| 6,897,963 | B1 | 5/2005 | Taniguchi et al. |
| 7,599,617 | B2 | 10/2009 | Tokiwa et al. |
| 2002/0102398 | A1 | 8/2002 | Shi et al. |
| 2005/0018155 | A1 | 1/2005 | Cox et al. |
| 2005/0280791 | A1 | 12/2005 | Nagasaka et al. |
| 2006/0040105 | A1 | 2/2006 | Sato et al. |
| 2007/0082129 | A1 | 4/2007 | Shimoda et al. |
| 2007/0127006 | A1 | 6/2007 | Shibazaki |
| 2007/0146663 | A1 | 6/2007 | Nagasaka |
| 2008/0018866 | A1 | 1/2008 | Nagasaka et al. |
| 2008/0174748 | A1 | 7/2008 | Nagasaka |
| 2008/0186462 | A1 | 8/2008 | Shima |
| 2008/0233425 | A1 | 9/2008 | Dekempeneer |
| 2008/0266533 | A1 | 10/2008 | Nagasaka et al. |
| 2009/0141376 | A1 | 6/2009 | Smith et al. |
| 2010/0060777 | A1 | 3/2010 | Yumiki |
| 2011/0256347 | A1* | 10/2011 | Manuad ............... C23C 16/0272 428/143 |
| 2012/0013864 | A1 | 1/2012 | Sato |
| 2013/0040247 | A1 | 2/2013 | Taki |
| 2013/0058640 | A1* | 3/2013 | Taki .................... C23C 14/0605 396/531 |
| 2014/0186716 | A1* | 7/2014 | Wu ....................... H01M 4/366 429/300 |
| 2014/0227644 | A1 | 8/2014 | Kishiume et al. |

FOREIGN PATENT DOCUMENTS

| | | | |
|---|---|---|---|
| JP | H06-212429 A | 8/1994 | |
| JP | H08-136991 A | 5/1996 | |
| JP | 2002-113604 A | 4/2002 | |
| JP | 2002-544380 A | 12/2002 | |
| JP | 2005-109426 A | 4/2005 | |
| JP | 2005-223315 A | 8/2005 | |
| JP | 2006-225686 A | 8/2006 | |
| JP | 2008-182241 A | 8/2008 | |
| JP | 2008-297477 A | 12/2008 | |
| JP | 2009-504919 A | 2/2009 | |
| JP | 2009-287099 A | 12/2009 | |
| WO | 01/35168 A1 | 5/2001 | |
| WO | 2004/019128 A2 | 3/2004 | |
| WO | 2011/081062 A1 | 7/2011 | |
| WO | 2011/138967 A1 | 11/2011 | |
| WO | WO 2011138967 A1 * | 11/2011 | ......... C23C 14/0605 |

OTHER PUBLICATIONS

Mar. 25, 2014 Written Opinion issued in International Patent Application No. PCT/JP2014/051234.

Amin et al; "Amorphous Carbonated Apatite on Diamond-Like Carbon Containing Titanium Oxide;" Diamond and Related Materials; Mar. 2009; vol. 18; pp. 1139-1144.

Chen et al; "Deposition of Titania-Containing Diamond-Like Carbon Nanocomposite Films by Sputtering-Assisted Chemical Vapor Deposition"; Plasma Processes and Polymers; 2011; vol. 8; pp. 324-332.

Apr. 28, 2014 International Search Report issued in International Patent Application No. JP2014/054332.

Sep. 24, 2014 Office Action issued in U.S. Appl. No. 14/159,871.

Aug. 2, 2011 International Search Report issued in International Patent Application No. PCT/JP2011/060609.

Nov. 7, 2013 Office Action issued in U.S. Appl. No. 13/666,523.

Mar. 12, 2013 Office Action issued in U.S. Appl. No. 13/666,523.

Jun. 3, 2014 Office Action issued in U.S. Appl. No. 13/666,523.

Dec. 31, 2014 Office Action issued in U.S. Appl. No. 13/666,523.

Aug. 2, 2011 Written Opinion of the International Searching Authority issued in International Patent Application No. PCT/JP2011/060609.

Jan. 6, 2014 Office Action issued in Chinese Patent Application No. 201180023017.3.

Lin et al., "Annealing Effect on the Structural, Mechanical and Electrical Properties of Titanium-Doped Diamond-Like Carbon Films," Thin Solid Films, vol. 518, No. 5, pp. 1503-1507, 2009.

Tay et al., "On the Properties of Nanocomposite Amorphous Carbon Films Prepared by Off-Plane Double Bend Filtered Cathodic Vacuum Arc," Thin Solid Films, vol. 420-421, pp. 177-184, 2002.

Zhang et al., "Surface Energy of Metal Containing Amorphous Carbon Films Deposited by Filtered Cathodic Vacuum Arc," Diamond and Related Materials, vol. 13, No. 3, pp. 459-464, 2004.

Dec. 20, 2013 Extended European Search Report issued in European Patent Application No. 11777486.9.

N. Fourches et al. "Plasma Deposition of Hydrogenated Amorphous Carbon: Growth Rates, Properties and Structures," Thin Solid Films, 240, pp. 28-38, 1994.

J. Robertson, "Hard Amorphous (Diamond-Like) Carbons," Prog. Solid St. Chern. vol. 21, pp. 199-333, 1991.

Aug. 27, 2014 Chinese Office Action, Second Examination Report issued in Chinese Patent Application No. 201180023017.3.

* cited by examiner

| Sample | Arc Current (A) | Bias Voltage (V) | Film Thickness (nm) | Film Chemical Composition (at%) | | | | | | | Electrical Resistivity (Ω·cm) | Film Stress (GPa) | Elastic Modulus (GPa) | Hardness (GPa) | Coefficient Of Kinetic Friction |
|---|---|---|---|---|---|---|---|---|---|---|---|---|---|---|---|
| | | | | sp²-C | sp³-C | Total C | Ti | H | O | Ti/C | | | | | |
| A | 60 | 0 | 306 | 24.4 | 59.7 | 84.1 | 15.5 | 0.4 | 0 | 0.18 | 9.1×10⁻⁴ | -1.25 | 152.1 | 12.3 | 0.08 |
| B | 60 | -66 | 280 | 23.0 | 62.2 | 85.2 | 14.6 | 0.1 | 0 | 0.17 | 6.9×10⁻⁴ | -1.31 | 144.6 | 12.6 | 0.08 |
| C | 60 | -198 | 270 | 33.3 | 52.2 | 85.5 | 14.4 | 0.1 | 0 | 0.17 | 6.6×10⁻⁴ | -1.14 | 137.8 | 11.9 | 0.08 |
| D | 60 | -330 | 328 | 34.0 | 50.9 | 84.9 | 14.9 | 0.1 | 0 | 0.18 | 6.6×10⁻⁴ | -0.94 | 135.6 | 11.6 | 0.08 |
| E | 60 | -495 | 284 | 36.7 | 48.6 | 85.3 | 14.6 | 0.1 | 0 | 0.17 | 6.4×10⁻⁴ | -0.76 | 134.1 | 11.8 | 0.08 |
| F | 60 | -660 | 309 | 37.5 | 47.7 | 85.2 | 14.7 | 0.1 | 0 | 0.17 | 5.9×10⁻⁴ | -0.64 | 130.0 | 11.5 | 0.08 |
| G | 60 | -990 | 271 | 37.1 | 47.3 | 84.4 | 15.4 | 0.2 | 0 | 0.18 | 5.7×10⁻⁴ | -0.51 | 126.1 | 11.4 | 0.08 |
| H | 60 | -1980 | 320 | 40.1 | 45.2 | 85.3 | 14.5 | 0.1 | 0 | 0.17 | 5.6×10⁻⁴ | -0.35 | 123.7 | 11.1 | 0.08 |

FIG. 6

| Sample | Arc Current (A) | Bias Voltage (V) | Film Thickness (nm) | Film Chemical Composition (at%) | | | | | | | Al/C | Electrical Resistivity (Ω·cm) | Film Stress (GPa) | Elastic Modulus (GPa) | Hardness (GPa) | Coefficient of Kinetic Friction |
|---|---|---|---|---|---|---|---|---|---|---|---|---|---|---|---|---|
| | | | | sp²-C | sp³-C | Total C | Al | Si | H | O | | | | | | |
| I | 70 | 0 | 295 | 32.7 | 58.2 | 90.9 | 7.9 | 1.1 | 0 | 0 | 0.09 | 7.6×10⁻³ | -2.56 | 191.2 | 19.8 | 0.09 |
| J | 70 | -66 | 287 | 28.1 | 62.7 | 90.8 | 7.9 | 1.2 | 0 | 0 | 0.09 | 7.6×10⁻³ | -2.74 | 201.5 | 21.0 | 0.09 |
| K | 70 | -1980 | 295 | 54.4 | 36.3 | 90.7 | 8.0 | 1.2 | 0 | 0 | 0.09 | 3.9×10⁻³ | -0.28 | 113.3 | 12.6 | 0.08 |

FIG. 7

| Sample | Nitrogen Gas Flow Rate (sccm) | Crystallinity | N/Cr Atomic Ratio | Electrical Resistivity (Ω·cm) | Hardness (GPa) | Coefficient Of Kinetic Friction | Load Capacity In Wear Test (g) |
|---|---|---|---|---|---|---|---|
| L | 0 | Crystalline | 0.00 | $1.7 \times 10^{-5}$ | 14.5 | 0.25-0.35 | 200 |
| M | 5 | Crystalline + non-crystalline | 0.05 | $4.9 \times 10^{-5}$ | 18.6 | 0.25-0.35 | 200 |
| N | 10 | Non-crystalline | 0.09 | $5.3 \times 10^{-5}$ | 22.5 | 0.2-0.3 | 1000 |
| O | 20 | Non-crystalline | 0.15 | $6.9 \times 10^{-5}$ | 21.3 | 0.2-0.3 | 1000 |
| P | 35 | Non-crystalline | 0.23 | $8.7 \times 10^{-5}$ | 20.9 | 0.2-0.3 | 1000 |
| Q | 40 | Non-crystalline | 0.37 | $1.2 \times 10^{-4}$ | 21.3 | 0.2-0.3 | 1000 |
| R | 80 | Crystalline + non-crystalline | 0.58 | $1.7 \times 10^{-4}$ | 26.5 | 0.25-0.35 | 500 |

FIG. 8

| Sample | Layer | Material | Bias Voltage (V) | Film Thickness (nm) | Total Film Stress (GPa) | Average Electrical Resistivity (Ω·cm) | Coefficient Of Kinetic Friction | Attachment/ Detachment Durability (cycles) |
|---|---|---|---|---|---|---|---|---|
| 1 (Working Example 1) | Third layer | CrNx | 0 | 20 | -0.85 | 1.2×10$^{-4}$ | 0.2-0.3 | 1320 |
| | Second layer | ta-C: Al | -1980 | 100 | | | | |
| | First layer | Ti | 0 | 200 | | | | |
| | Lens mount | Polycarbonate | | | | | | |
| 2 (Working Example 2) | Third layer | CrNx | 0 | 20 | -0.50 | 3.1×10$^{-5}$ | 0.2-0.3 | 1570 |
| | Second layer | ta-C: Ti | -1980 | 100 | | | | |
| | First layer | Ti | 0 | 200 | | | | |
| | Lens mount | Polycarbonate | | | | | | |
| 3 (Working Example 3) | Fourth layer | CrNx | 0 | 20 | -1.10 | 5.2×10$^{-5}$ | 0.2-0.3 | 6800 |
| | Third layer | ta-C: Ti | -1980 | 100 | | | | |
| | Second layer | ta-C:Ti | 0 | 100 | | | | |
| | First layer | Ti | 0 | 100 | | | | |
| | Lens mount | Polycarbonate | | | | | | |
| 4 (Comparison Example 1) | Second layer | ta-C: Al | -1980 | 100 | -0.80 | 2.3×10$^{-4}$ | 0.08-0.09 | 1260 |
| | First layer | Ti | 0 | 200 | | | | |
| | Lens mount | Polycarbonate | | | | | | |
| 5 (Comparison Example 2) | Second layer | ta-C: Ti | -1980 | 100 | -0.45 | 2.3×10$^{-5}$ | 0.07-0.08 | 1450 |
| | First layer | Ti | 0 | 200 | | | | |
| | Lens mount | Polycarbonate | | | | | | |
| 6 (Comparison Example 3) | Third layer | ta-C: Ti | -1980 | 100 | -1.00 | 4.1×10$^{-5}$ | 0.07-0.08 | 6700 |
| | Second layer | ta-C: Ti | 0 | 100 | | | | |
| | First layer | Ti | 0 | 100 | | | | |
| | Lens mount | Polycarbonate | | | | | | |

FIG. 9

SLIDING FILM, MEMBER ON WHICH SLIDING FILM IS FORMED, AND MANUFACTURING METHOD THEREFOR

CROSS-REFERENCE TO RELATED APPLICATIONS

This application is a Continuation Application of International Application No. PCT/JP2014/054332 claiming the conventional priority of Japanese patent Application No. 2013-039900 filed on Feb. 28, 2013 and titled "Conductive Sliding Film, Member on which Conductive Sliding Film is Formed, and Manufacturing Method Therefor". The disclosures of Japanese patent Application No. 2013-039900 and International Application No. PCT/JP2014/054332 are incorporated herein by reference in their entirety.

TECHNICAL FIELD

The present teaching relates to a sliding film that can be formed on the surface of members that slide relatively to each other and to a member such as a camera mount on which the sliding film is formed.

BACKGROUND

In configurations in which members slide relative to each other or members (connecting members) which connect by sliding relative to a contact surface with another member, a film is typically formed covering the sliding surfaces of the members. Examples of such members include exterior finishing materials for optical devices or the like. Examples of such connecting members include so-called bayonet mounts (below, simply "mounts") provided on the camera body side and lens side of camera systems in which different lens units can be interchangeably attached to and detached from the camera body. Such mounts generally include a base material made from brass and a conductive, protective film made from metallic chromium and formed on the surface of the base material.

Recently, use of conductive carbon films made from a metal-doped tetrahedral amorphous carbon material in place of the conventional metallic chromium films has been proposed (WO 2011/138967).

SUMMARY

The present teaching aims to provide a sliding film and a connecting member with high wear resistance and suitable sliding properties that is also conductive and can transmit electrical signals. The present teaching also aims to provide a member such as a camera mount, a camera body and a lens unit equipped with such a sliding film and connecting member.

A first aspect of the present teaching provides a sliding film formed on a surface of a member which slides relative to another member, including:

a metal-doped tetrahedral amorphous carbon layer; and a surface layer that is formed on top of the metal-doped tetrahedral amorphous carbon layer and has a higher coefficient of kinetic friction than the metal-doped tetrahedral amorphous carbon layer.

A second aspect of the present teaching provides a mount for a camera body and/or a camera lens of a camera system in which the lens unit is attachable/detachable to and from the camera body, including:

a base material; and a sliding film formed on the base material, wherein the sliding film includes a metal-doped tetrahedral amorphous carbon layer and a surface layer that is formed on top of the metal-doped tetrahedral amorphous carbon layer and has a higher coefficient of kinetic friction than the metal-doped tetrahedral amorphous carbon layer.

A third aspect of the present teaching provides a camera body on which the mount described in the second aspect is provided.

A fourth aspect of the present teaching provides a lens unit on which the mount described in the second aspect is provided.

BRIEF DESCRIPTION OF THE DRAWING(S)

Figure 3:
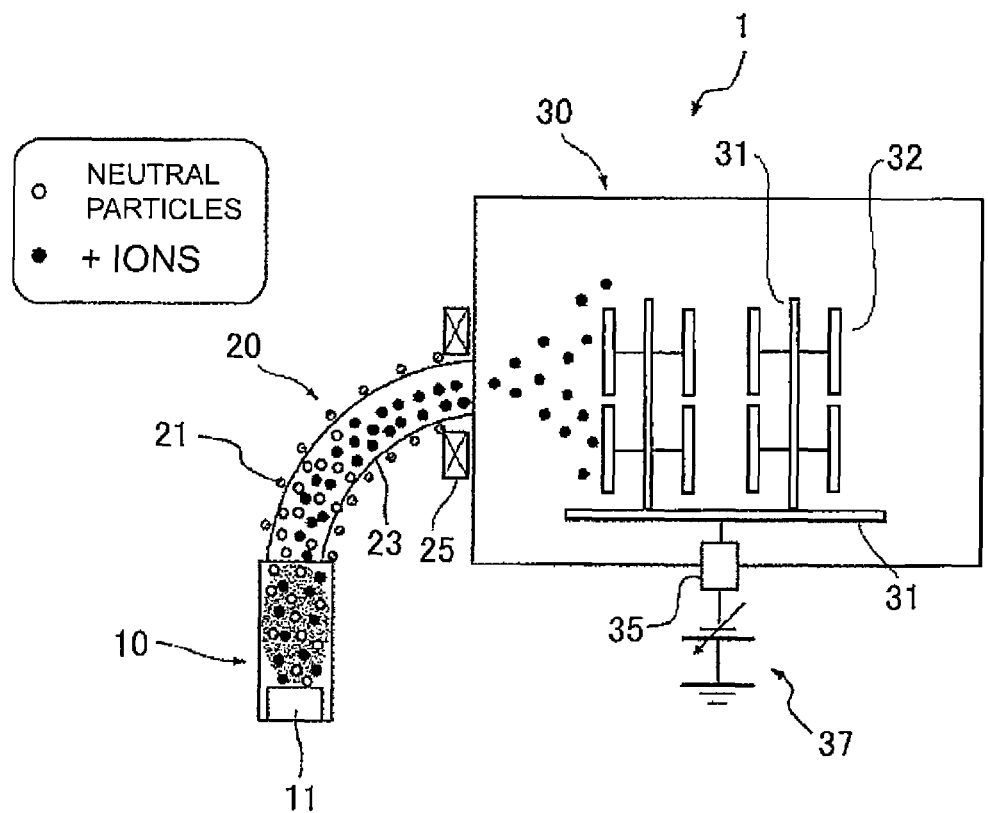

FIG. 3 schematically illustrates a configuration of an FCVA film formation device.

Figure 4:
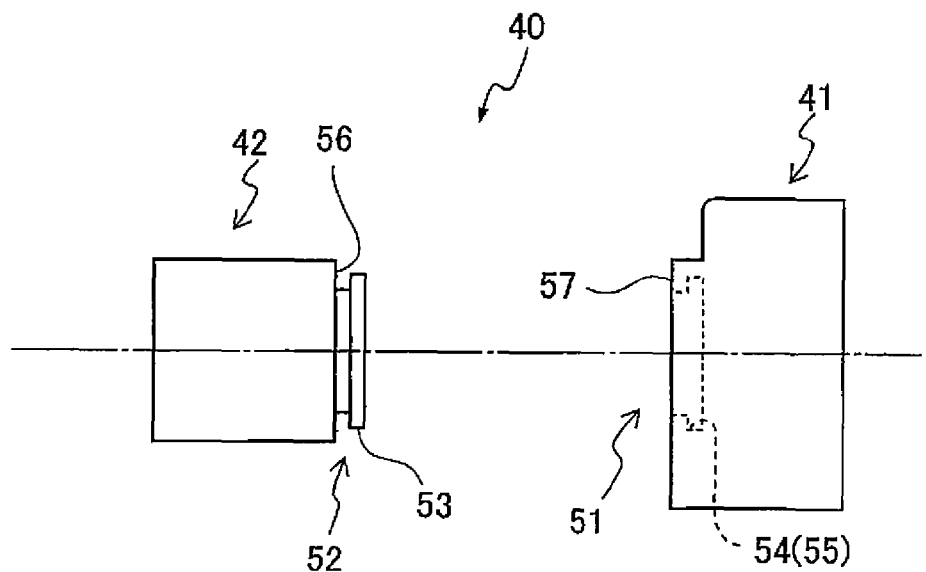

FIG. 4 schematically illustrates a camera system having an interchangeable lens that can be attached to/detached from a camera body.

Figure 5A:
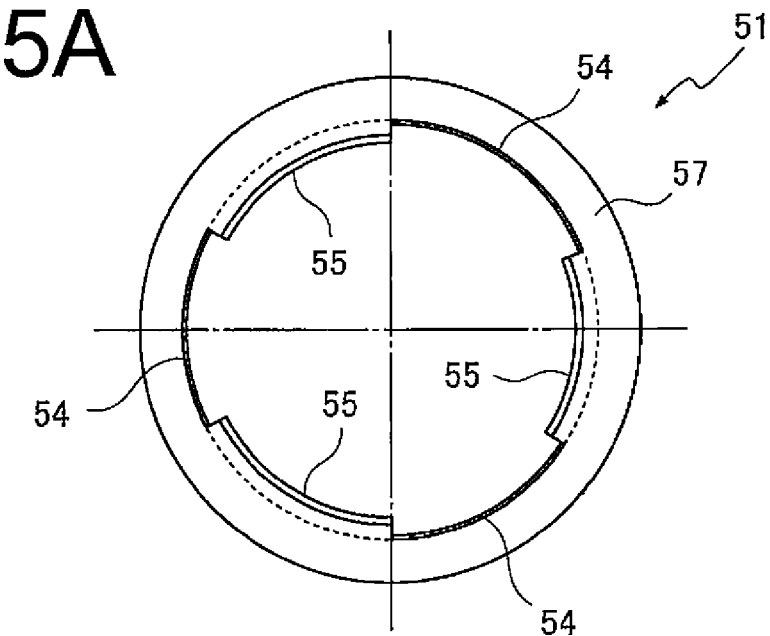
Figure 5B:
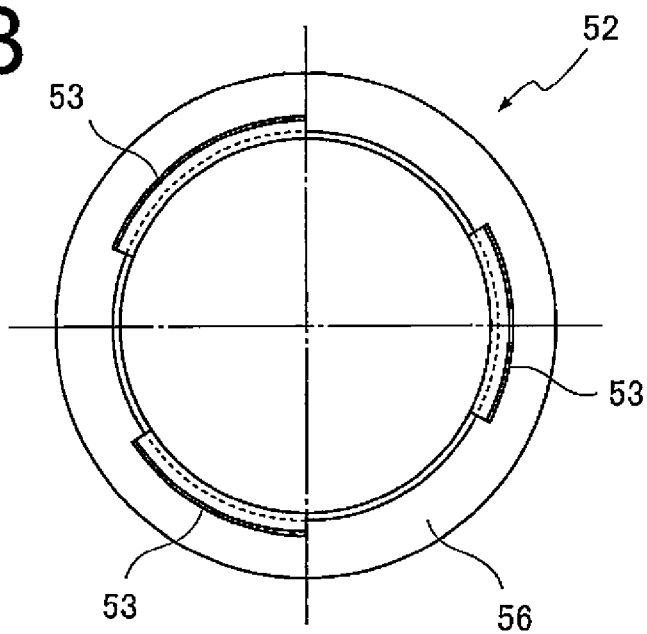

FIG. 5A is a plan view of a camera body side bayonet mount for the camera body illustrated in FIG. 4. FIG. 5B is a plan view of an interchangeable lens side bayonet mount for the interchangeable lens illustrated in FIG. 4.

FIG. 6 is a table of the film formation conditions, compositions, and physical properties of sample films A to H formed in Preliminary Experiment 1.

FIG. 7 is a table of the film formation conditions, compositions, and physical properties of sample films I to K formed in Preliminary Experiment 1.

FIG. 8 is a table of the film formation conditions, compositions, and physical properties of sample films L to R formed in Preliminary Experiment 2.

FIG. 9 is a table of the film structures, film formation conditions, and physical properties of sample films 1 to 6 formed in working examples and comparative examples.

EMBODIMENTS

Figure 1:
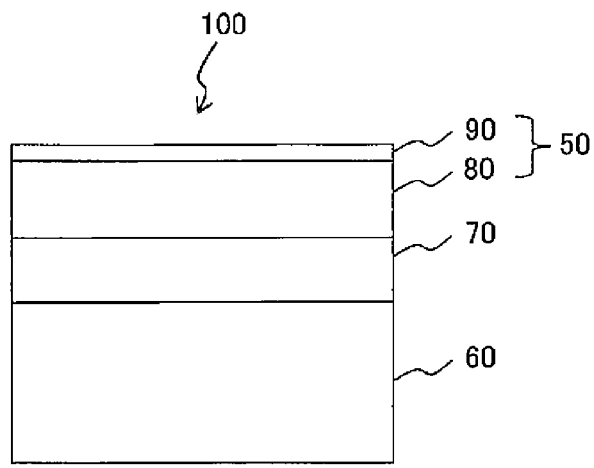
FIG. 1 is a cross-sectional view schematically illustrating the surface of a mount according to an embodiment of the present teaching.

An embodiment of the present teaching will be described below with reference to figures. As illustrated in FIG. 1, a mount 100 according to the present embodiment includes: a base material 60; a metal layer 70 formed on top of the base material 60; a metal-doped tetrahedral amorphous carbon layer 80 formed on top of the metal layer 70; and a conductive layer 90 formed on top of the metal-doped tetrahedral amorphous carbon layer 80. Together, the metal-doped tetrahedral amorphous carbon layer 80 and the conductive layer 90 form a sliding film 50 (a conductive sliding film) having a conductivity. As illustrated in FIG. 1, the conductive layer 90 forms the surface of the sliding film 50 and will therefore also be referred to as the "surface layer" of the sliding film 50.

<Base Material>

A variety of materials can be used for the base material 60 according to the application at hand. In camera system mount applications, examples of materials for the base material 60 include inorganic materials including ceramics and metals such as brass as well as organic materials such as resins. The base material 60 may have any shape. A variety of types of thermoplastic resins can be used for the base material 60. It is preferable that a resin well-suited to mass production processes such as injection molding is used. Examples of such resins include: polycarbonates; polyethylenes; polyvinyl chlorides; polystyrenes; ABS resins; polypropylenes; polyvinyl acetates; acrylic resins (PMMA); polyethylene terephthalate (PET); fluororesins such as polytetrafluoroethylene (PTFE); polyether ether ketone (PEEK); polyamide-imides (PAD; polyphenylene sulfide (PPS); polyester resins; and mixed resins in which glass fibers or carbon fibers are added to one of the resins listed above.

<Metal Layer>

The metal layer 70 is formed when a resin etc. is used for the base material 60 in order to control stress and to improve adhesion of the sliding film 50. However, configurations in which the metal layer 70 is not formed may also be used. Examples of materials for the metal layer 70 include Ti, Al, Fe, Ni, Co, and Cr as well as alloys of these metals. The metal layer 70 may include a single layer or a plurality of layers. The metal layer 70 can be formed using a filtered cathodic vacuum arc (FCVA) process, sputtering, ion plating, vacuum deposition, or the like. It is preferable that the film thickness of the metal layer 70 be in the range of 20 to 300 nm. This is because if the film thickness of the metal layer 70 is less than 20 nm, it is difficult to form a continuous film. Moreover, if the film thickness of the metal film 70 is greater than 300 nm, an excessive number of air gaps tend to form. In both cases, the adhesion of the sliding film 50 to the base material 60 suffers, and the advantageous stress control effect of the sliding film 50 is reduced.

<Tetrahedral Amorphous Carbon Layer>

Figure 2:
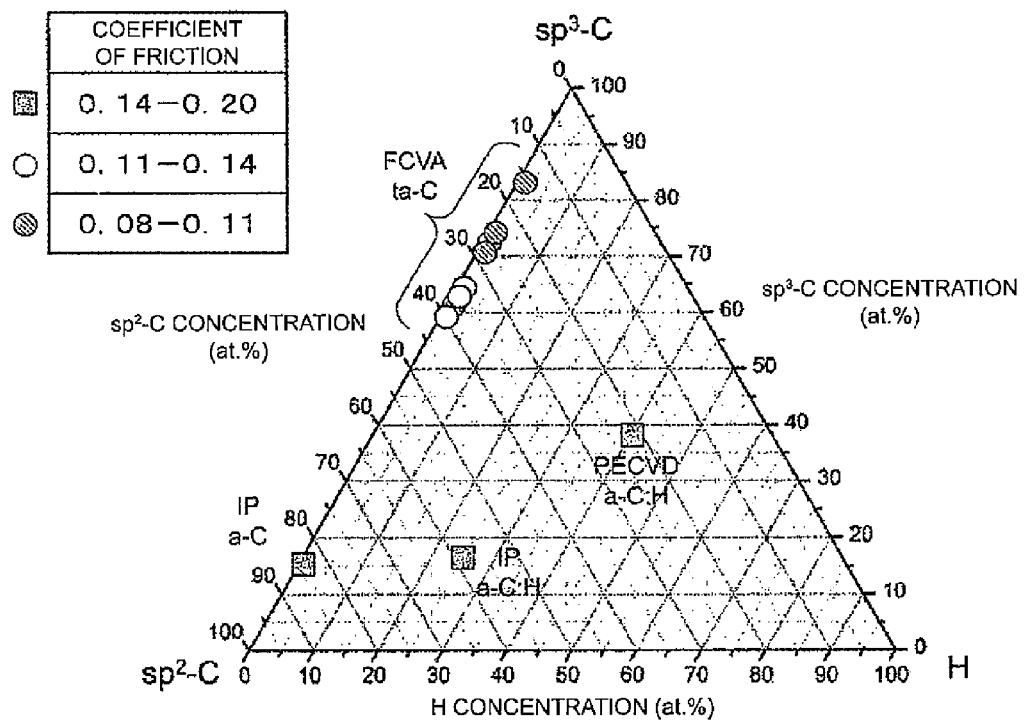
FIG. 2 is a ternary plot (state diagram) illustrating the compositions of carbon-hydrogen materials.

Tetrahedral amorphous carbon is an amorphous carbon (a-C) material in which the composition ratio of $sp^3$ bonded carbon ($sp^3$-C) is particularly high (approximately, from 30 to 90 at %). FIG. 2 is a composition state diagram (composition diagram, state diagram) of a ternary carbon-hydrogen composition made from $sp^3$ bonded carbon ($sp^3$-C), $sp^2$ bonded carbon ($sp^2$-C), and H. In FIG. 2, the values on the bottom side of the triangle indicate the composition ratio of H, the values on the right side indicate the composition ratio (concentration) of $sp^3$-C, and the values on the left side indicate the composition ratio (concentration) of $sp^2$-C. Moreover, the PECVD square represents a carbon-hydrogen composition manufactured using a plasma CVD process using methane as a source material, and the IP squares represent carbon-hydrogen compositions manufactured using an ion plating process using benzene as a source material.

In this composition diagram, each vertex of the triangle represents a material of a single bond type and containing a single ingredient. The top vertex, labeled $sp^3$-C, represents pure $sp^3$ bonded carbon (diamond). The lower left vertex, labeled $sp^2$-C, represents pure $sp^2$ bonded carbon (graphite). The lower right vertex, labeled H, represents pure hydrogen. Both pure $sp^3$-C (diamond) and pure $sp^2$-C (graphite) are made entirely from carbon. However, these two materials are allotropes with clearly different crystal structures resulting from the different type of interatomic bonds present in each.

Each side of the triangle (excluding the vertices) represents an amorphous two-ingredient composition. The side between the top vertex ($sp^3$-C) and the lower left vertex ($sp^2$-C) represents carbon compositions containing a random mixture of $sp^3$-C and $sp^2$-C in a composition ratio given by the specific point on that axis. These non-hydrogen containing carbon compositions are known as amorphous carbon (below, simply "a-C").

Amorphous carbon compositions with a high (approximately, from 30 to 90%) composition ratio of $sp^3$-C are known as tetrahedral amorphous carbon (below, simply "ta-C"). Tetrahedral amorphous carbon does not contain any hydrogen and contains only $sp^3$-C and $sp^2$-C. Here, "does not contain any carbon" means that these materials contain a lower amount of hydrogen (less than or equal to 0.3 at %, for example) than the amount that might be detected within a measurement device itself (that is, these materials are substantially free of hydrogen). When attempting to measure the composition of an amorphous carbon layer, background hydrogen may be detected because of the existence of hydrogen inside the measurement device (due to infiltration of hydrogen into the vacuum chamber of the measurement device, for example), but such cases should be treated as the material being substantially free of hydrogen. Such tetrahedral amorphous carbons can be manufactured using an FCVA process but have never been manufactured using conventional thermal CVD processes, plasma CVD processes, or PVD processes such as sputtering, ion plating, or vacuum deposition.

The interior region of the triangle represents three-ingredient carbon-hydrogen compositions containing a random mixture of $sp^3$-C, $sp^2$-C, and hydrogen. These hydrogen-containing carbon-hydrogen compositions are known as hydrogenated amorphous carbon (below, simply "a-C: H"). Hydrogenated amorphous carbon materials that contain a high composition ratio of $sp^3$-C (the upper interior region of the triangle in the composition diagram) are known as hydrogenated tetrahedral amorphous carbon (below, simply "ta-C: H"). Because ta-C: H contains hydrogen, it exhibits inferior sliding properties (coefficient of friction) in comparison with ta-C (which does not contain hydrogen) when used as a sliding material. ta-C: H is also exhibits inferior hardness and heat resistance in comparison with ta-C.

It is well known that pure $sp^3$-C (diamond) exhibits extremely high hardness, is transparent to light in the visible spectrum, and acts as an electrical insulator. Meanwhile, pure $sp^2$-C (graphite) is soft, opaque to light in the visible spectrum (having a black color), and self-lubricating (has a low coefficient of friction). In other words, while diamond ($sp^3$-C) and graphite ($sp^2$-C) are both pure carbon materials, each exhibits very different characteristics.

Amorphous carbon materials on the axis between $sp^3$-C (diamond) and $sp^2$-C (graphite) in the composition diagram exhibit characteristics of both diamond and graphite and act more similar to one or the other depending on the composition ratio. Therefore, as the amount of $sp^3$-C increases, the resulting film becomes harder and exhibits increased transmittance of visible light. For reference, FIG. 2 also illustrates the ranges of coefficients of friction of amorphous carbons manufactured using PECVD, IP, and FCVA processes. Even tetrahedral amorphous carbon materials formed using an FCVA process exhibit a reduced coefficient of friction as the $sp^3$-C content increases.

Although amorphous carbon materials make it possible to preserve characteristics of both diamond and graphite and thereby achieve good wear resistance and sliding properties, amorphous carbons previously could not be made conductive so that they could transmit electrical signals like metallic chromium. Moreover, it was previously difficult to achieve a desirable metallic external appearance when using amorphous carbons. This is because the covalent bonds between carbon atoms in diamond have no free electrons (which is what gives diamond its extremely high hardness), while properties like conductivity and metallic luster are typically only present in materials with a high number of free electrons. The present teaching utilizes a tetrahedral amorphous carbon material doped with a metal M (below, simply "ta-C: M") to make it possible to successfully manufacture a sliding film that is both conductive and has satisfactory wear resistance.

In order to achieve conductivity and good wear resistance, and particularly in order to achieve good conductivity, examples of usable doping metals for the tetrahedral amorphous carbon include Ti, Ni, Cr, Al, Mg, Cu, Fe, Ag, Au, and Pt. It is preferable that Ti, Al, Cr, Ni, or Fe be used. It is preferable that the metal content (doping amount) be from 1 to 33 at % in order to suitably maintain the wear resistance and conductivity of the tetrahedral amorphous carbon, and it is particularly preferable that the metal content be from 1 to 20 at %. If the metal content is less than 1 at %, the conductivity tends to be insufficient, and the electrical resistance of the tetrahedral amorphous carbon tends to increase. If the metal content is greater than 20 at %, the hardness and wear resistance of the tetrahedral amorphous carbon tend to decrease.

In the metal-doped tetrahedral amorphous carbon layer 80 of the present embodiment, it is preferable that the amount of $sp^3$-C be less than or equal to 59 at %. If the $sp^3$-C content of the metal-doped tetrahedral amorphous carbon layer 80 is greater than 59 at %, the metal-doped tetrahedral amorphous carbon layer 80 experiences large compressive stress and tends to separate easily from the base material.

It is preferable that the metal-doped tetrahedral amorphous carbon layer 80 of the present embodiment have a film thickness greater than or equal to 100 nm. If the metal-doped tetrahedral amorphous carbon layer 80 has a film thickness less than 100 nm, the electrical resistance of the sliding film tends to increase, and the wear resistance tends to decrease. Moreover, production time and cost tends to increase if the metal-doped tetrahedral amorphous carbon layer 80 has too large a film thickness. For purposes of manufacturing efficiency, the maximum film thickness can be set to 500 nm.

The $sp^3$-C content (percentage) of the metal-doped tetrahedral amorphous carbon layer 80 is expressed by the following formula.

($sp^3$-C content)=(number of $sp^3$-C atoms)/[(number of $sp^3$-C atoms)+(number of $sp^2$-C atoms)+(number of metal atoms)]

The $sp^2$-C content (percentage) and the metal content (percentage) can be expressed in a similar manner.

<Conductive Layer>

The conductive layer 90 is formed in order to give the sliding film 50 suitable sliding properties (a suitable coefficient of friction). Examples of materials that can be used for the conductive layer 90 include CrNx, NiNx, and the like. The conductive layer 90 can be formed using an FCVA process, sputtering, ion plating, or the like. It is preferable that the conductive layer 90 have a film thickness greater than or equal to 10 nm, and it is particularly preferable that the conductive layer 90 have a film thickness greater than or equal to 20 nm. If the conductive layer 90 has a film thickness less than 10 nm, a continuous film cannot be formed, and a sufficient conductivity cannot be achieved. Moreover, production time and cost tends to increase if the conductive layer 90 has too large a film thickness. For purposes of manufacturing efficiency, the maximum film thickness can be set to 100 nm. Furthermore, when a CrNx film is used for the conductive layer 90 of the present embodiment, it is preferable that the CrNx film have an amorphous (non-crystalline) structure because the coefficient of friction increases if the CrNx film has a crystalline structure. More specifically, it is preferable that the CrNx film have a composition ratio in which x<0.5 (where x is the atomic ratio N/Cr), and it is particularly preferable that x satisfy 0.05<x<0.5. CrNx films having a composition ratio that satisfies the range above exhibit satisfactory wear resistance and are well-suited to applications which demand good mechanical durability. If x≥0.5, the coefficient of friction tends to increase, and if x≤0.05, the coefficient of friction tends to increase and the hardness tends to decrease.

<Characteristics of Applications in Camera Mounts>

In mount systems in which a body-side mount and a lens-side mount interlock by sliding relative to one another, suitable sliding properties (coefficient of friction) and good wear resistance (surface hardness) are required. Moreover, the mounts must be electrically conductive so that the camera body and the lens unit have the same ground potential and so that the mounts can transmit electrical signals. Furthermore, a beautiful metallic luster and corrosion resistance are required to maintain a good aesthetic appearance. Sliding properties and wear resistance are related to one another, and therefore these values must be adjusted to achieve a good balance. If the surface hardness of the mounts is too high, for example, it is more difficult to attach the lens unit to the camera body (operability is degraded) because of the high resulting coefficient of friction. Conversely, if the surface hardness of the mounts is less than a prescribed hardness, the surface treatments (films) become more prone to damage and separation from the base material. Therefore, the coefficient of friction and surface hardness must be set to values at which the lens unit can be easily attached to/detached from the camera body and at which the surface treatments can withstand a prescribed number of attachments/detachments.

It is preferable that the sliding film 50 of the present embodiment have an electrical resistivity in the range of $1 \times 10^{-5}$ to $1 \times 10^{-3}$ Ω·cm. This ensures that in cameras with automatic lens control features such as autofocusing lenses or the like, for example, electrical signals can be sent between the camera body and lens unit via the sliding film 50 by applying the sliding film 50 to the respective mounts. Moreover, some users frequently attach and remove lens units, flash units, and the like to and from the camera body. If the sliding film 50 is applied to the mounts for such components, this repeated attachment/detachment can cause the sliding film 50 formed on the sliding portions of the mounts to separate from the base material over time. Furthermore, when such separation occurs, electrical signals can no longer be sent between the lens unit and camera body via the sliding film 50. Therefore, the sliding film 50 must have sufficient wear resistance and hardness. The sliding film 50 of this embodiment of the present teaching has a coefficient of kinetic friction in the range of 0.2 to 0.3. The presence of the sliding film 50 makes it possible to smoothly attach and detach the lens unit to and from the camera body via the sliding film 50 and reduces the risk that the user will drop or otherwise damage any components while attaching/detaching the lens unit to/from the camera body. As described above, the sliding portions of camera mounts are required to simultaneously have i) low electrical resistance ii) a suitable hardness (wear resistance), and iii) a suitable coefficient of kinetic friction. However, increasing the doping amount of metal to decrease the electrical resistance results in a decrease in both hardness and wear resistance. Meanwhile, if the hardness is too high, the coefficient of kinetic friction also increases, and the sliding properties suffer. Therefore, a good balance is required to be achieved between the abovementioned three characteristics in sliding films for camera mounts.

The inventor conducted an experiments and found that when a sliding film including, as main components, the abovementioned metal-doped tetrahedral amorphous carbon layer and conductive layer is used on a camera mount, a particularly good balance between the abovementioned three characteristics is achieved when the electrical resistivity of the sliding film is from $1\times10^{-5}$ to $1\times10^{-3}$ Ω·cm and the coefficient of kinetic friction is from 0.2 to 0.3.

Next, a method for manufacturing the sliding film of the present embodiment will be described.

<Method for Manufacturing Sliding Film>

A FCVA process and a schematic structure of a film formation device 1 carrying out the FCVA process will be described with reference to FIG. 3, as one example of a method for forming the sliding film on a base material.

The FCVA film formation device 1 includes an arc plasma generator 10, a filter 20, and a film formation chamber 30. The arc plasma generator 10 and the film formation chamber 30 are connected to one another by the duct-shaped filter 20. A vacuum from $10^{-5}$ to $10^{-7}$ Torr in strength is drawn on the film formation chamber 30 using a vacuum device (not illustrated in the figure).

The arc plasma generator 10 includes a target 11 (cathode) and an anode (striker). The striker contacts the target 11 and then immediately moves away from the target 11 to create an arc discharge, thereby generating arc plasma. The arc plasma releases neutral particles and charged particles from the target 11. These particles proceed through the filter 20 towards the film formation chamber 30.

The filter 20 includes a duct 23 having an electromagnet coil 21 wrapped therearound as well as an ion scanning coil 25. The duct 23 is arranged between the arc plasma generator 10 and the film formation chamber 30 and has a double-bend shape with two portions orthogonal to one another (that is, the duct 23 is bent in a first direction and also bent in a second direction orthogonal to the first direction). The electromagnet coil 21 is wrapped around the periphery of the duct 23. The curved (double-bend) shape of the duct 23 ensures that the neutral particles in the duct 23 collide with and accumulate on the interior walls thereof, thereby removing the neutral particles. A current is passed (flown) through the electromagnet coil 21 to create a Lorentz force on the charged particles inside the duct 23. This keeps the charged particles concentrated at the center region of the cross section of the duct 23 as those charged particles are guided along the curved duct 23 towards the film formation chamber 30.

In other words, the electromagnet coil 21 and the duct 23 function as a narrow-band electromagnetic spatial filter that allows only charged particles to pass through and does so in a very efficient manner.

The ion scanning coil 25 scans the beam of charged particles that pass through the duct 23 into the film formation chamber 30. A holder 31 is provided inside the film formation chamber 30, and a base material 32 is set up on the surface of this holder 31. The holder 31 is rotated around its own center and revolved around the shaft of a motor 35 by the motor 35. A desired bias voltage can be applied to the holder 31 by a power source 37. The beam of particles scanned by the ion scanning coil 25 is directed at (incident on) the surface of the base material 32 supported by the holder 31, thereby forming a uniform film on the base material.

To form the metal-doped tetrahedral amorphous carbon layer 80, a metal-containing graphite target is used. As described above, examples of metals that may be used include Ti, Ni, Cr, Al, Mg, Cu, Fe, Ag, Au, Pt, and the like.

The metal content of the ta-C: M film can be controlled by adjusting the amount of metal contained in the target which is the material for the ta-C: M film. Moreover, applying a suitable negative bias voltage, for example, makes it possible to very efficiently form a ta-C: M film with the desired composition ratio (of $sp^3$-C to $sp^2$-C). The metal-doped tetrahedral amorphous carbon layer 80 is formed on top of base material of any shape made from an organic material such as a resin or from an inorganic material such as a metal or a ceramic, or alternatively, on top of a metal layer formed on top of the base material.

To form a conductive layer 90 made from a CrNx material, a metallic Cr target made by using a melting process or a powder metallurgy process and then machining the resulting material into the desired shaped is used. The film formation chamber 30 is filled with nitrogen gas, and the nitrogen gas is then turned into plasma. Inside the film formation chamber 30, the active Cr and nitrogen species in the plasma phase react chemically either near or on the surface of the base material, thereby forming a chromium nitride (CrNx) film as the conductive layer 90. Controlling the flow rate of the nitrogen gas to be introduced into the film formation chamber 30 makes it possible to very efficiently form a conductive layer with the desired composition ratio (the x in CrNx, that is, the atomic ratio N/Cr). The conductive layer 90 is formed on top of the metal-doped tetrahedral amorphous carbon layer 80.

<Member on which Sliding Film is Formed>

The present embodiment also provides a member on which the sliding film described above is formed. In light of the high wear resistance, suitable sliding properties, and high conductivity (low electrical resistance) of the sliding film of the present embodiment, the sliding film can be used on a wide variety of members or components. However, the sliding film is particularly suited to use on members which slide relative to another member and to use on members which connect or lock to another member by means of a sliding process. The sliding film is also well-suited to use on pairs of members that slide relative to one another and to use on member sets or kits that connect or lock together by means of a sliding process. The sliding film is particularly well-suited to use on the lens unit side mount and/or the camera body side mount of a camera system in which lens units can be attached to and detached from the camera body. These mounts will be briefly described with reference to FIG. 4 and FIGS. 5A and 5B. A camera 40 includes a camera body 41 and an interchangeable lens 42 that can be attached to and detached from the camera body 41. The camera body 41 and the interchangeable lens 42 each have a bayonet mount (below, simply "mount"). Tabs 53 are formed protruding outwards on the male mount 52 of the interchangeable lens 42. In the female mount 51 of the camera body 41, recesses 54 into which the tabs 53 of the male mount 52 are inserted and locking members 55 to which the tabs 53 lock are formed. Locking mechanisms (not illustrated in the figure) are formed using elastic members or the like on one or both of the tabs 53 and the locking members 55.

To attach the interchangeable lens 42 to the camera body 41, the tabs 53 of the male mount 52 are inserted into the recesses 54 of the female mount 51, and the abutting surface 56 of the male mount 52 is brought into contact with the receiving surface 57 of the female mount 51. The interchangeable lens 42 is then rotated relative to the camera body 41. At this time, the abutting surface 56 and the receiving surface 57 slide over one another. The attachment process is then completed by rotating the interchangeable lens 42 further until the tabs 53 of the male mount 52 lock into the locking members 55 of the female mount 51. At this time, the surfaces of the tabs 53 and the surfaces of the locking members 55 slide over one another. To detach the interchangeable lens 42 from the camera body 41, the steps above are reversed. As described above, when the interchangeable lens 42 is changed, the female mount 51 of the camera body 41 and the male mount 52 of the interchangeable lens 42 slide over one another.

In the female mount 51 and the male mount 52, the sliding film 50 of the present embodiment is formed as illustrated in FIG. 1 on top of base materials 60 shaped like the female mount 51 and the male mount 52. The base materials 60 may be formed using a metal, resin, ceramic, or the like but are typically formed using a resin. As illustrated in FIG. 1, a metal layer 70 may be formed between each base material 60 and the sliding film 50 of the present embodiment. The sliding film 50 is formed on the surface of each base material 60 or each metal layer 70 with sufficient adhesion thereto using the FCVA process described above. The sliding film 50 may have a multilayer structure in which a plurality of films is layered on top of one another. When the sliding film 50 is a multilayer film, the uppermost layers are the sliding film as described in the present embodiment.

The present embodiment also includes a camera body and/or a lens unit of the type illustrated in FIGS. 4 and 5. The lens unit side mount and/or the camera body side mount are not limited to bayonet mounts and may also be threaded mounts, for example.

EXAMPLES

Next, methods for manufacturing a sliding film and a member on which the sliding film is formed according to working examples will be described. However, the present teaching is not limited to these working examples.

In Preliminary Experiments 1 and 2, metal-doped tetrahedral amorphous carbon film samples and CrNx film samples were formed under a variety of formation conditions and then evaluated.

Preliminary Experiment 1

Metal-doped tetrahedral amorphous carbon film samples were formed under a variety of formation conditions on top of monocrystalline Si(100) wafer substrates. Then, electrical resistivity, film stress, hardness, elastic modulus, film composition, and coefficient of friction were evaluated for each film.

Samples A to H

For each sample, a ta-C: Ti film (titanium-doped tetrahedral amorphous carbon film) was formed on an Si(100) substrate using an FCVA process. A sintered graphite target containing 2.15 at % Ti was used as the metal-containing target 11. A dehydration treatment was performed on the sintered graphite target. The following standard operating conditions were used for the FCVA film formation device 1 (see FIG. 3) during formation of the ta-C: Ti films. The arc current of the arc power source (cathode power source) of the arc plasma generator 10 was set to 60 A. The current (filter current) of the electromagnet coil 21 of the filter 20 was set to 13 A. The current (anode current) of the anode power source of the arc plasma generator 10 was set to 8 A. The voltage (duct voltage) of the ion scanning coil 25 was set to 0.2 V. The table in FIG. 6 illustrates the values used for the bias voltage that was actually applied to the Si(100) substrate (actual bias voltage) at a frequency of 1500 Hz for each of samples A to H. It should be noted that all of the ta-C: Ti films were formed with a film thickness of approximately 300 nm by controlling the film formation time.

Samples I to K

For each sample, a ta-C: Al film (aluminum-doped tetrahedral amorphous carbon film) was formed on an Si(100) substrate using an FCVA process. A sintered graphite target containing 8.5 at % Al was used for the target 11. A dehydration treatment was performed on the sintered graphite target. The following standard operating conditions were used for the FCVA film formation device 1 (see FIG. 3) during formation of the ta-C: Al films. The arc current was set to 70 A. The table in FIG. 7 shows the values used for the bias voltage that was actually applied to the Si(100) substrate (actual bias voltage) at a frequency of 1500 Hz for each of samples I to K. All of the other conditions were the same as for samples A to H. It should be noted that all of the ta-C: Al films were formed with a film thickness of approximately 300 nm by controlling the film formation time.

The chemical composition of each of the films in samples A to K was measured using Rutherford backscattering spectrometry (RBS) and hydrogen forward scattering spectrometry (HFS). The ratios of $sp^2$-C (hybridized orbitals) and $sp^3$-C (hybridized orbitals) were measured using X-ray photoelectron spectroscopy (XPS). Moreover, the film thickness of each film was measured with a stylus profilometer. The tables in FIGS. 6 and 7 show the measurement results.

The hydrogen (H) content of the films in samples A to H was from 0.1 to 0.4 at %. The target 11 contained no hydrogen, and the dehydration treatment was performed thereon. Therefore, this hydrogen content was likely from the measurement device itself (background hydrogen).

The amount (percentage) of $sp^3$-C with respect to the entire atoms in the films in samples A to H was from 45.2 to 62.2 at %. This makes it clear that the films in samples A to H were indeed made of metal-doped tetrahedral amorphous carbon.

The hydrogen (H) content of each of the films in samples I to K was 0.0 at %.

The amount (percentage) of $sp^3$-C with respect to the entire atoms in the films in samples I to K was from 36.3 to 62.7 at %. This makes it clear that the films in samples I to K were indeed made of metal-doped tetrahedral amorphous carbon.

For each of samples A to K, physical properties of the films such as electrical resistivity, film stress, hardness, elastic modulus, and coefficient of friction were measured as follows.

(1) Electrical Resistivity

Electrical resistivity (volume resistivity) was calculated by measuring the sheet resistance of each metal-doped tetrahedral amorphous carbon film formed on the respective Si(100) substrate using the four-terminal method and then multiplying the resulting sheet resistance values by the film thickness of the respective metal-doped tetrahedral amorphous carbon film. The tables in FIGS. 6 and 7 show the calculated electrical resistivity values. The electrical resistivity of each of the ta-C: Ti films formed in samples A to H was between $1\times10^{-4}$ and $1\times10^{-3}$ Ω·cm. The electrical resistivity of each of the ta-C: Al films formed in samples I to K was between $1\times10^{-3}$ and $1\times10^{-2}$ Ω·cm.

(2) Film Stress

Film stress was measured for the films in samples A to K. Film stress was calculated by measuring the radius of curvature of each substrate before and after film formation using a stylus surface profiler and then using the appropriate Young's modulus and Poisson's ratio of the substrate. The tables in FIGS. 6 and 7 show the results. The negative film stress values in the tables indicate that the films are under compressive stress. The metal-doped tetrahedral amorphous carbon films in samples C to H and sample K (which had less than or equal to 59 at % carbon atoms with $sp^3$ hybridized orbitals) exhibited lower compressive stresses than the metal-doped tetrahedral amorphous carbon films in samples A, B, I, and J (which had greater than 59 at % carbon atoms with $sp^3$ hybridized orbitals). Therefore, the former group of films is less prone to separation from the base material (substrate) and is well-suited to applications that demand mechanical durability.

(3) Hardness and Elastic Modulus

Hardness and elastic modulus were measured regarding the metal-doped tetrahedral amorphous carbon films formed on the Si(100) substrates at a plurality of sampling points using nanoindentation. The tables in FIGS. 6 and 7 show the measured hardness and elastic modulus values for samples A to K. Hardness ranged from 11 to 21 GPa for the films in samples A to K. Elastic modulus ranged from 113 to 202 GPa. For reference, the hardness of a conventional metallic chromium film formed on a brass base material is approximately 8 GPa. Therefore, the metal-doped tetrahedral amorphous carbon films of samples A to K exhibited a hardness approximately 1.5 times greater than a conventional metallic chromium film.

(4) Coefficient of Friction

The wear properties of the films formed on the Si(100) substrates in samples A to K were measured using the ball-on-disk method. An alumina ball was used for the measurement. The applied load was set to 200 gf. The radius of rotation was set to 2 mm, and the rotational speed was set to 100 rpm. For each of the films in samples A to K, the average value of the coefficient of kinetic friction over the testing period was measured. The tables in FIGS. 6 and 7 show the results. The coefficient of kinetic friction of each of the films in samples A to K was less than 0.1. This indicates that the films in samples A to K exhibit extremely low coefficients of kinetic friction and too high a degree of slidability.

As described above, Preliminary Experiment 1 demonstrated that each of the metal-doped tetrahedral amorphous carbon films in samples A to K exhibited high conductivity (low electrical resistivity) and high hardness but extremely low frictional coefficients and too high a degree of slidability. Furthermore, the metal-doped tetrahedral amorphous carbon films which had less than or equal to 59 at % carbon atoms with $sp^3$ hybridized orbitals exhibited low compressive stresses. Therefore, these films are less prone to separation from the base material and are well-suited to applications that demand mechanical durability.

Preliminary Experiment 2

CrNx sample films were formed on Si(100) substrates under a variety of film formation conditions. Next, the crystallinity, electrical resistivity, hardness, film composition, coefficient of friction, and wear resistance of each sample film were evaluated.

Samples L to R

For each sample, a CrNx film was formed on a base material using an FCVA process. The following standard operating conditions were used for the FCVA film formation device 1 (see FIG. 3) during formation of the CrNx films. The arc current of the arc power source (cathode power source) of the arc plasma generator 10 was set to 160 A. The current (filter current) of the electromagnet coil 21 of the filter 20 was set to 7.5 A. The current (anode current) of the anode power source of the arc plasma generator 10 was set to 10.5 A. The voltage (duct voltage) of the ion scanning coil 25 was set to 0.5 V. The voltage of the bias power source was left floating. Moreover, the flow rate of nitrogen gas into the film formation chamber 30 was set to a prescribed value in the range of 0 to 80 seem. It should be noted that all of the CrNx films were formed with a film thickness of approximately 100 nm by controlling the film formation time.

The crystallinity of each of the films in samples L to R was evaluated using X-ray diffraction (XRD). The chemical composition of each of the films was measured using Rutherford backscattering spectrometry (RBS). The table in FIG. 8 shows the results.

The CrNx films in samples N, O, P, and Q had x values (that is, an atomic ratio N/Cr) from 0.09 to 0.37 and were determined to be non-crystalline (amorphous) using XRD. Meanwhile, the CrNx films in samples L and M had x values less than or equal to 0.05, and the CrNx film in sample R had an x value of 0.58. Using XRD, the CrNx films in samples L, M, and R were determined to be crystalline or a crystalline and non-crystalline mixture.

For each of samples L to R, physical properties of the films such as electrical resistivity, hardness, coefficient of friction, and wear resistance were measured as follows.

(1) Electrical Resistivity

Electrical resistivity (volume resistivity) was calculated by measuring the sheet resistance of each CrNx film formed on the respective Si(100) substrate using the four-terminal method and then multiplying the resulting sheet resistance values by the film thickness of the respective CrNx film. The table in FIG. 8 shows the calculated electrical resistivity values. The electrical resistivity of each of the films in samples L to R was between $1 \times 10^{-5}$ and $2 \times 10^{-4}$ Ω·cm.

(2) Hardness

Hardness was measured regarding the CrNx films formed on the Si(100) substrates at a plurality of sampling points using nanoindentation. The table in FIG. 8 shows the measured hardness values for samples L to R. The hardness of samples L to R ranged from 14 to 27 GPa. Note that the hardness of a conventional metallic chromium film formed on a brass base material is approximately 8 GPa. Therefore, the CrNx films in samples L to R exhibited a hardness at least 1.5 times greater than a conventional metallic chromium film.

(3) Coefficient of Friction

The wear properties of the films formed on the Si(100) substrates in samples L to R were measured using the ball-on-disk method. An alumina ball was used for the measurement. The applied load was set to 200 gf. The radius of rotation was set to 2 mm, and the rotational speed was set to 100 rpm. For each of the films in samples L to R, the average value of the coefficient of kinetic friction over the testing period was measured. The table in FIG. 8 shows the results. The CrNx films in samples L to R all had a coefficient of kinetic friction in the range of 0.2 to 0.4. This indicates that the films have suitable sliding properties.

(4) Wear Resistance

The sliding durability of the films formed on the Si(100) substrates in samples L to R was measured using the ball-on-disk method. A SUS420J2 ball was used for the measurement. The radius of rotation was set to 2 mm, and the rotational speed was set to 100 rpm. The applied load was set to a starting value of 50 g. The wear experiment was continued for 5 minutes with the applied load fixed at that value, and then, if the film had not yet separated from the base material, the applied load was increased and the experiment was repeated. By repeating this process, the applied load at which the film separated from the base material (the load capacity, in g) was measured. The table in FIG. 8 shows the results. The CrNx films in samples N, O, P, and Q (which had x values of 0.05<x<0.5) had a load capacity of 1000 g and therefore exhibited satisfactory wear resistance. However, the CrNx films in samples L, M, and R (which had x values of x<0.05 or x>0.5) had a load capacity less than or equal to 500 g and therefore exhibited decreased wear resistance.

As described above, Preliminary Experiment 2 demonstrated that each of the CrNx films in samples L to R exhibited high conductivity (low electrical resistivity), high hardness, and suitable sliding properties (suitable coefficients of friction). Furthermore, the CrNx films having x values that satisfied 0.05<x<0.5 exhibited satisfactory wear resistance and are well-suited to applications that demand good mechanical durability.

Next, working examples in which sliding films were manufactured on the basis of the results of Preliminary Experiments 1 and 2 will be described.

In these working examples, the sliding films were formed on polycarbonate lens mount-shaped base materials. Then, the electrical resistivity, film stress, coefficient of friction, and attachment/detachment durability of the sliding films were evaluated.

Sample 1

Working Example 1

A Ti film was formed as a metal layer on the polycarbonate base material using an FCVA process. The following operating conditions were used for the FCVA film formation device 1 (see FIG. 3) during formation of the Ti film. The arc current of the arc power source (cathode power source) of the arc plasma generator 10 was set to 140 A. The current (filter current) of the electromagnet coil 21 of the filter 20 was set to 7.5 A. The current (anode current) of the anode power source of the arc plasma generator 10 was set to 10.5 A. The voltage (duct voltage) of the ion scanning coil 25 was set to 0.5 V. The voltage of the bias power source was left floating. The Ti film was formed with a film thickness of approximately 200 nm by controlling the film formation time.

Next, a ta-C: Al film (aluminum-doped tetrahedral amorphous carbon film) was formed as a metal-doped tetrahedral amorphous carbon layer on top of the Ti film using an FCVA process. A sintered graphite target containing 8.5 at % Al was used as the metal-containing target 11. A dehydration treatment was performed on the sintered graphite target. The following operating conditions were used for the FCVA film formation device 1 (see FIG. 3) during formation of the ta-C: Al film. The arc current of the arc power source (cathode power source) of the arc plasma generator 10 was set to 70 A. The current (filter current) of the electromagnet coil 21 of the filter 20 was set to 13 A. The current (anode current) of the anode power source of the arc plasma generator 10 was set to 8 A. The voltage (duct voltage) of the ion scanning coil 25 was set to 0.2 V. A voltage of −1980 V was used for the bias voltage that was actually applied to the base material (actual bias voltage) at a frequency of 1500 Hz. The ta-C: Al film was formed with a film thickness of approximately 100 nm by controlling the film formation time.

Furthermore, a CrNx film was formed as a conductive layer on top of the ta-C: Al film using an FCVA process. The following operating conditions were used for the FCVA film formation device 1 (see FIG. 3) during formation of the CrNx film. The arc current of the arc power source (cathode power source) of the arc plasma generator 10 was set to 160 A. The current (filter current) of the electromagnet coil 21 of the filter 20 was set to 7.5 A. The current (anode current) of the anode power source of the arc plasma generator 10 was set to 10.5 A. The voltage (duct voltage) of the ion scanning coil 25 was set to 0.5 V. The voltage of the bias power source was left floating. The flow rate of nitrogen gas into the film formation chamber 30 was set to 35 sccm. The CrNx film was formed with a film thickness of approximately 20 nm by controlling the film formation time.

Sample 2

Working Example 2

The sliding film formed on top of the polycarbonate base material in sample 2 was identical to the sliding film of sample 1 except in that a ta-C: Ti film (titanium-doped tetrahedral amorphous carbon film) was formed as the metal-doped tetrahedral amorphous carbon layer using an FCVA process. A Ti film and a CrNx film were formed by the processes same as processes for formation of the Ti film and the CrNx film in sample 1, respectively. A sintered graphite target containing 2.15 at % Ti was used as the target 11 for formation of the ta-C: Ti film, and the following operating conditions were used for the FCVA film formation device 1 (see FIG. 3). The arc current of the arc power source (cathode power source) of the arc plasma generator 10 was set to 60 A. The current (filter current) of the electromagnet coil 21 of the filter 20 was set to 13 A. The current (anode current) of the anode power source of the arc plasma generator 10 was set to 8 A. The voltage (duct voltage) of the ion scanning coil 25 was set to 0.2 V. A voltage of −1980V was used for the bias voltage that was actually applied to the base material (actual bias voltage) at a frequency of 1500 Hz. The ta-C: Ti film was formed with a film thickness of approximately 100 nm by controlling the film formation time.

Sample 3

Working Example 3

The sliding film formed on top of the base material in sample 3 was identical to the sliding film of sample 2 except in that the film thickness of the Ti film was set to 100 nm and the film thickness of the ta-C: Ti film (titanium-doped tetrahedral amorphous carbon film) serving as the metal-doped tetrahedral amorphous carbon layer was set to 200 nm. A Ti film and a CrNx film were formed by the processes same as processes for formation of the Ti film and the CrNx film in sample 2, respectively. Moreover, to form the ta-C: Ti film, first a ta-C: Ti film with a film thickness of 100 nm was formed using the same operating conditions for the FCVA film formation device 1 that were used for formation of the ta-C: Ti film in sample 2 except for the voltage of the bias power source, which was left floating. Next, another ta-C: Ti film with a film thickness of 100 nm was formed using the same operating conditions for the FCVA film formation device 1 that were used for formation of the ta-C: Ti film in sample 2.

Samples 4 to 6

Comparative Examples 1 to 3

The sliding films formed on top of the base material in samples 4 to 6 (Comparative Examples 1 to 3) were identical to the sliding films formed in samples 1 to 3 except in that no CrNx film was formed as a conductive layer. Each film in samples 4 to 6 is formed by the process same as process for formation of the correspondent film in samples 1-3.

Physical properties such as electrical resistivity, film stress, coefficient of friction, and attachment/detachment durability were measured for each of the sliding films in samples 1 to 6 as described below.

(1) Electrical Resistivity

Electrical resistivity (volume resistivity) was calculated by measuring the sheet resistance of each sliding film using the four-terminal method and then multiplying the resulting sheet resistance values by the film thickness of the respective sliding film. The table in FIG. 9 shows the calculated electrical resistivity values. The electrical resistivity of each of the sliding films in samples 1 to 6 was between $1\times10^{-5}$ and $1\times10^{-3}$ $\Omega\cdot cm$. This indicates that each of the sliding films in samples 1 to 6 exhibited electrical resistivity values suitable for use in real applications.

(2) Film Stress

Film stress was calculated by measuring the radius of curvature of each base material before and after sliding film formation using a stylus surface profiler and then using the appropriate Young's modulus and Poisson's ratio. The table in FIG. 9 shows the calculated film stress values. The negative film stress values in the tables indicate that the films are under compressive stress. The absolute value of the film stress of each of the sliding films in samples 1 to 6 was less than or equal to 1.1 GPa. This indicates that compressive stress is sufficiently small enough to make these films suitable for applications that demand mechanical durability.

(3) Coefficient of Friction

The wear properties of the sliding films in samples 1 to 6 were measured using the ball-on-disk method. An alumina ball was used for the measurement. The applied load was set to 200 gf. The radius of rotation was set to 2 mm, and the rotational speed was set to 100 rpm. For each of the films in samples 1 to 6, the average value of the coefficient of kinetic friction over the test period was measured. The table in FIG. 9 shows the results. The measurement results revealed that the sliding films in samples 1 to 3 all had a coefficient of kinetic friction in the range of 0.2 to 0.3. This indicates that the films have suitable sliding properties. Meanwhile, the coefficient of kinetic friction of each of the sliding films in samples 4 to 6 (Comparative Examples 1 to 3) was less than 0.1. This indicates that these films exhibit extremely low coefficients of kinetic friction and too high a degree of slidability. If such super low-friction films are used on mounts in a camera system, the torque required to attach/detach the lens unit is extremely small, and the lens unit can be detached with a smaller force than the user might expect. Therefore the user is more likely to accidentally drop the lens unit from the camera body.

(4) Attachment/Detachment Durability (Evaluation of Wear Resistance)

Next, the performance of the sliding films when used on camera mounts was evaluated as described below. Conventional Cr-plated brass body side mounts and the polycarbonate lens side mounts on which the sliding films in samples 1 to 6 were formed were used for the evaluation. These mounts were attached to camera bodies and lens units (interchangeable lenses), respectively, and the lens units were then repeatedly attached to and detached from the camera bodies. The number of attachment/detachment times until each of the sliding films was completely separated (peeled off) from the base member and each of the base members was exposed was counted. The table in FIG. 9 shows the results. The results revealed that the sliding films in samples 1 to 6 enabled the lens units to be attached to/detached from the camera bodies from 1200 to 6800 times and exhibited extremely exceptional wear resistance.

The evaluation results described above indicated that the sliding films of the working examples exhibited high conductivity capable of transmitting an electrical signal, have satisfactory wear resistance, and have suitable sliding properties due to suitable coefficients of friction. The new sliding film according to an aspect of the present teaching simultaneously displays all of these characteristics. Moreover, the sliding film of this aspect of the present teaching exhibits a substantially uniform and high reflectance of from 55 to 65% with respect to visible light (having wavelengths from 370 to 670 nm) and can have exactly the same appearance as a silver-toned metal.

Connecting members in which a connection surface of the connecting member on which such a sliding film is formed slides relative to a connection surface of another member can be safely and easily attached to/detached from the other member due to these suitable sliding properties. Moreover, deterioration of the sliding film due to repeated attachment/detachment accompanying the relative sliding is reduced by the high wear resistance of the sliding film. In configurations in which the sliding film is formed on the surface of a metal base material, connecting portions with complex structures and/or high-precision connection portions can be easily formed, and simultaneously, connecting members in which the connection surfaces have a higher hardness than can be achieved using metal coatings can be obtained. Meanwhile, in configurations in which the sliding film is formed on the surface of a resin base material, connecting members in which the connection surfaces have a higher hardness and conductivity than can be achieved using resin-only components can be provided easily and at low cost. Moreover, such configurations make it possible to achieve lighter components (products) than can be achieved using equivalent metal-only components (metal-only components having the same shape).

Furthermore, the sliding film according to this aspect of the present teaching exhibits higher sliding durability and conductivity than a metallic chromium film even when the sliding film is thinner than the metallic chromium film. Therefore, film formation time can be reduced by making the total film thickness of the sliding film smaller than the thickness of a conventional metallic chromium film, thereby providing additional cost savings.

In configurations in which the connecting member includes a first connecting member and a second connecting member that can be attached to/detached from one another by sliding relative to one another, these connecting members are slid relative to one another to connect them together, and thereby the first and second connecting members are connected together both mechanically and electrically. In such configurations, it is possible to exhibit various advantageous effects by making suitable use of the high hardness, suitable coefficient of friction, and conductivity of the sliding film achieved by the sliding films in the working examples described above. One of the best representative examples of an application of this sliding film is use on the body side mounts, lens unit side mounts, or other brackets to which accessories such as different flashes can be attached in camera systems in which lens units can be interchangeably attached to and detached from the camera body. In such applications, the sliding film preserves the good aesthetic appearance of the components as well.

The sliding films in the working examples described above can all be formed using an FCVA process. The FCVA process is a dry process that does not require use of chemical substances harmful to the human body such as the hexavalent chromium used in conventional chrome-plating methods. Therefore, such sliding films can be produced without a harmful impact on the environment.

Preferable embodiments of the present teaching were described above; however, the present teaching is not limited to these embodiments. For example, titanium and aluminum were given as examples of the doping metal M for the ta-C: M films. However, from the description above, a person skilled in the art understands that any doping metal can be used as long as that doping metal makes the ta-C-based film conductive. Other metal elements such as Ni, Cr, Mg, Cu, Fe, Ag, Au, or Pt may also be used as the doping metal.

Moreover, mounts for camera system (such as silver halide cameras, digital still cameras, or video cameras) in which lens units can be interchangeably attached to/detached from the camera body were given as a specific example of connecting members that can be connected by sliding relative to one another and to which the sliding film can be suitably applied. However, the present teaching is not limited to this application and may be used in a wide variety of applications. Other examples of applications in which the sliding film can be used to achieve the same or similar effects include electrical connectors, slip rings, connection devices, and connecting members in devices such as cameras and mobile phones.

In the above embodiments, the surface layer of the sliding film (conductive layer 90) may have a coefficient of kinetic friction from 0.2 to 0.3.

In the above embodiments, the surface layer of the sliding film (conductive layer 90) may be made from a material having an electrical resistivity from $5\times10^{-6}$ to $5\times10^{-4}$ $\Omega\cdot$cm.

In the sliding film of the above embodiments, the metal-doped tetrahedral amorphous carbon layer may consists of carbon atoms with $sp^2$ hybridized orbitals, carbon atoms with $sp^3$ hybridized orbitals, and metal atoms, and an amount (a percentage) of carbon atoms with $sp^3$ hybridized orbitals in the metal-doped tetrahedral amorphous carbon layer may be less than or equal to 59 at %.

In the sliding film of the above embodiments, the doping metal used for the metal-doped tetrahedral amorphous carbon layer may be at least one metal selected from the group consisting of Ti, Al, Fe, Ni, Co, and Cr.

In the above embodiments, the surface layer of the sliding film may be a chromium nitride film. Furthermore, the surface layer may be a chromium nitride $CrN_x$ film with x<0.5.

In the above embodiments, the surface layer of the mount may have a coefficient of kinetic friction from 0.2 to 0.3.

In the above embodiments, the surface layer of the mount may be made from a material having an electrical resistivity from $5\times10^{-6}$ to $5\times10^{-4}$ $\Omega\cdot$cm. Furthermore, the electrical resistivity of the sliding film may be from $1\times10^{-5}$ to $1\times10^{-3}$ $\Omega\cdot$cm.

In the mount of the above embodiments, the metal-doped tetrahedral amorphous carbon layer may consists of carbon atoms with $sp^2$ hybridized orbitals, carbon atoms with $sp^3$ hybridized orbitals, and metal atoms, and an amount (a percentage) of carbon atoms with $sp^3$ hybridized orbitals in the metal-doped tetrahedral amorphous carbon layer may be less than or equal to 59 at %.

In the mount of the above embodiments, the doping metal used for the metal-doped tetrahedral amorphous carbon layer may be at least one metal selected from the group consisting of Ti, Al, Fe, Ni, Co, and Cr.

In the above embodiments, the surface layer of the mount may be a chromium nitride film. Furthermore, the surface layer may be a chromium nitride $CrN_x$ film with x<0.5.

In the above embodiments, the base material of the mount may be a resin material.

In the above embodiments, the mount may further include a metal layer made from at least one metal selected from the group consisting of Ti, Al, Fe, Ni, Co, and Cr and formed between the base material and the metal-doped tetrahedral amorphous carbon layer.

In the mount of the above embodiments, the thickness of the metal-doped tetrahedral amorphous carbon layer may be from 100 to 500 nm, and the thickness of the surface layer may be from 10 to 100 nm.

The embodiments described above make it possible to provide a sliding film (a conductive sliding film) and a member with high wear resistance and suitable sliding properties that is also conductive and can transmit electrical signals, specifically to provide a member suitable for application to a camera mount.

What is claimed is:

1. A sliding film formed on a surface of a member which slides relative to another member, comprising:
   a metal-doped tetrahedral amorphous carbon layer; and
   a surface layer that is formed on top of the metal-doped tetrahedral amorphous carbon layer and has a higher coefficient of kinetic friction than the metal-doped tetrahedral amorphous carbon layer, wherein a coefficient of kinetic friction of the surface layer is from 0.2 to 0.3.

2. The sliding film according to claim 1, wherein the surface layer is made from a material having an electrical resistivity from $5\times10^{-6}$ to $5\times10^{-4}$ $\Omega\cdot$cm.

3. The sliding film according to claim 1,
   wherein the metal-doped tetrahedral amorphous carbon layer consists of carbon atoms with $sp^2$ hybridized orbitals, carbon atoms with $sp^3$ hybridized orbitals, and metal atoms, and
   wherein a percentage of carbon atoms with $sp^3$ hybridized orbitals in the metal-doped tetrahedral amorphous carbon layer is less than or equal to 59 at %.

4. The sliding film according to claim 1, wherein a doping metal used for the metal-doped tetrahedral amorphous carbon layer is at least one metal selected from the group consisting of Ti, Al, Fe, Ni, Co, and Cr.

5. The sliding film according to claim 1, wherein the surface layer is a chromium nitride film.

6. The sliding film according to claim 5, wherein the surface layer is a chromium nitride $CrN_x$ film with x<0.5.

7. A mount for a camera body and/or a camera lens of a camera system in which the lens unit is attachable/detachable to and from the camera body, comprising:
   a base material; and
   a sliding film formed on the base material,
   wherein the sliding film includes a metal-doped tetrahedral amorphous carbon layer, and a surface layer that is formed on top of the metal-doped tetrahedral amorphous carbon layer and has a higher coefficient of kinetic friction than the metal-doped tetrahedral amorphous carbon layer, and wherein a coefficient of kinetic friction of the surface layer is from 0.2 to 0.3.

8. The mount for the camera system according to claim 7, wherein the surface layer is made from a material having an electrical resistivity from $5\times10^{-6}$ to $5\times10^{-4}$ Ω·cm.

9. The mount for the camera system according to claim 7, wherein an electrical resistivity of the sliding film is from $1\times10^{-5}$ to $1\times10^{-3}$ Ω·cm.

10. The mount for the camera system according to claim 7,
wherein the metal-doped tetrahedral amorphous carbon layer consists of carbon atoms with $sp^2$ hybridized orbitals, carbon atoms with $sp^3$ hybridized orbitals, and metal atoms, and
wherein a percentage of carbon atoms with $sp^3$ hybridized orbitals in the metal-doped tetrahedral amorphous carbon layer is less than or equal to 59 at %.

11. The mount for the camera system according to claim 7, wherein a doping metal used for the metal-doped tetrahedral amorphous carbon layer is at least one metal selected from the group consisting of Ti, Al, Fe, Ni, Co, and Cr.

12. The mount for the camera system according to claim 7, wherein the surface layer is a chromium nitride film.

13. The mount for the camera system according to claim 12, wherein the surface layer is a chromium nitride $CrN_x$ film with x<0.5.

14. The mount for the camera system according to claim 7, wherein the base material is made from a resin.

15. The mount for the camera system according to claim 7, further comprising:
a metal layer made from at least one metal selected from the group consisting of Ti, Al, Fe, Ni, Co, and Cr is formed between the base material and the metal-doped tetrahedral amorphous carbon layer.

16. The mount for the camera system according to claim 7,
wherein a thickness of the metal-doped tetrahedral amorphous carbon layer is from 100 to 500 nm, and
wherein a thickness of the surface layer is from 10 to 100 nm.

17. A camera body on which the mount as defined in claim 7 is provided.

18. A lens unit on which the mount as defined in claim 7 is provided.

* * * * *